United States Patent
McDaniel (10) Patent No.: US 7,902,057 B2
(45) Date of Patent: Mar. 8, 2011

(54) METHODS OF FABRICATING DUAL FIN STRUCTURES

(75) Inventor: Terrence McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 636 days.

(21) Appl. No.: 11/831,296

(22) Filed: Jul. 31, 2007

(65) Prior Publication Data
US 2009/0032866 A1 Feb. 5, 2009

(51) Int. Cl.
*H01L 21/3205* (2006.01)

(52) U.S. Cl. .......... 438/589; 438/197; 438/241; 438/242; 257/E21.023

(58) Field of Classification Search .................. 438/197, 438/241, 242, 589; 257/E21.023
See application file for complete search history.

(56) References Cited

U.S. PATENT DOCUMENTS

| 4,881,105 | A | 11/1989 | Davari et al. |
| 6,218,217 | B1 | 4/2001 | Uenish et al. |
| 6,642,570 | B2 | 11/2003 | Tseng |
| 6,794,710 | B2 | 9/2004 | Chang et al. |
| 2005/0179030 | A1 | 8/2005 | Seo et al. |
| 2006/0046407 | A1 | 3/2006 | Juengling |
| 2006/0189043 | A1 | 8/2006 | Schulz |
| 2007/0176253 | A1* | 8/2007 | Wang et al. .................. 257/506 |

OTHER PUBLICATIONS

PCT International Search Report for Application No. PCT/US2008/071827 dated Jan. 16, 2009.
PCT International Preliminary Report on Patentability for Application No. PCT/US2008/071827 dated Feb. 11, 2010.

* cited by examiner

*Primary Examiner* — Zandra Smith
*Assistant Examiner* — Christy L Novacek
(74) *Attorney, Agent, or Firm* — TraskBritt (57) ABSTRACT

Fin-FET devices and methods of fabrication are disclosed. The Fin-FET devices include dual fins that may be used to provide a trench region between a source region and a drain region. In some embodiments, the dual fins may be formed by forming a trench with fin structures on opposite sides in a protruding region of a substrate. The dual fins may be useful in forming single-gate, double-gate or triple-gate fin-FET devices. Electronic systems including such fin-FET devices are also disclosed.

24 Claims, 7 Drawing Sheets

FIG. 22

METHODS OF FABRICATING DUAL FIN STRUCTURES

FIELD OF THE INVENTION

Embodiments of the present invention relate generally to methods for fabricating so-called "fin" field effect transistors, or "fin-FETs," which protrude from an active surface of a semiconducting substrate and, more specifically, to embodiments of methods for fabricating fin-FETs in which each active-device region includes two fins, as well as to semiconductor device structures with dual fins.

BACKGROUND OF THE INVENTION

The performance of silicon-based complementary metal-oxide-semiconductor (CMOS) transistors steadily improves as device dimensions shrink. The decreasing size of metal-oxide-semiconductor field-effect transistor (MOSFET) provides improved integrated-circuit performance speed and cost per function. As channel lengths of MOSFET devices are reduced to increase both the operation speed and the number of components per chip, the source and drain regions extend towards each other, occupying the entire channel area between the source and the drain. Interactions between the source and drain of the MOSFET degrade the ability of the gate of the MOSFET to control whether the MOSFET is "on" or "off." In particular, the threshold voltage and drive current decrease appreciably with the channel length. This phenomenon is called the "short channel effect." The term "short channel effect," as used herein, refers to the limitations on electron drift characteristics and modification of the threshold voltage caused by shortening trench lengths.

Double or tri-gate transistors, such as vertical double gate silicon-on-insulator (SOI) transistors or fin-FETs, offer significant advantages related to high drive current and high immunity to short trench effects. Conventionally, fin-FET devices have included single, unitary semiconductor structures that protrude from an active surface of a substrate. Such a semiconductor structure is generally referred to as a "fin." A polysilicon material may be deposited over a central portion of the fin and patterned to form a pair of gates on opposite sides of the fin. Among the many advantages offered by fin-FETs is better gate control at short gate lengths. Fin-FETs facilitate down-scaling of CMOS dimensions while maintaining acceptable performance.

With ever-decreasing semiconductor device feature sizes, the aforementioned short channel effects attributable to shortened channel lengths become increasingly problematic in the fabrication of semiconductor devices.

Methods of fabricating semiconductor devices, including dual fin structures, to reduce short channel effects and increase drive current, as well as improved fin-FET structures, are desirable.

DETAILED DESCRIPTION OF THE INVENTION

Embodiments of methods for fabricating semiconductor device structures with dual fins are disclosed, as are embodiments of semiconductor device structures including dual fin-FETs, and systems incorporating same. As used herein, the term "fin" includes a semiconducting material that is etched into a substantially vertically extending structure, relative to a major plane of a substrate on which the structure is formed, that will form the active regions of a semiconductor device such as source, drain and trench. The methods disclosed herein may be used to fabricate a variety of devices such as dynamic random access memory (DRAM) devices, CMOS devices, and other devices in which fin-FETs would be suitable and increases in drive current are desired.

Reference will now be made to the figures wherein like numerals represent like elements. The figures are not necessarily drawn to scale. Elements in the figures are drawn in cross-section.

FIGS. 1-6 depict, in simplified cross-section, an embodiment of a process for forming a dual fin structure on a substrate 110. As used herein, the term "substrate" includes a base material or construction in and upon which various features may be formed. Various embodiments of substrates include, but are not limited to, full or partial wafers of semiconductor material (e.g., silicon, gallium arsenide, indium phosphide, etc.) and semiconductor-on-insulator (SOI) type substrates such as silicon-on-ceramic (SOC), silicon-on-glass (SOG), and silicon-on-sapphire (SOS) substrates.

Figure 1:
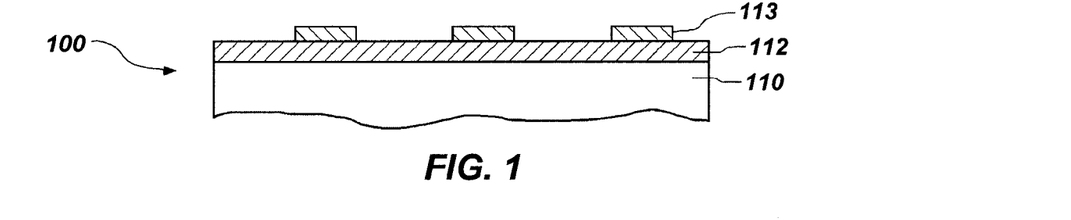
FIGS. 1-11 are cross-sectional views of various embodiments of intermediate semiconductor device structures illustrating embodiments of a dual fin-FET fabrication method.

A mask material 112 may be formed on or otherwise applied to substrate 110, as shown in FIG. 1. Mask material 112 may, in some embodiments, comprise a dielectric material, such as silicon nitride ($Si_3N_4$) or silicon dioxide ($SiO_2$). The dielectric material may be applied to the substrate 110 by conventional techniques including, but not limited to, chemical vapor deposition (CVD), pulsed layer deposition (PLD), atomic layer deposition (ALD), and the like. In other embodiments, mask material 112 may be applied and spread across (e.g., by spin-on processes) substrate 110, grown on substrate 110, or formed by other suitable techniques.

In some embodiments, the mask material 112 may be patterned using known photomask and/or transparent carbon (TC) mask forming techniques along with known etching techniques. The photomask and/or transparent carbon mask 113 that may be formed over the mask material 112 may include solid regions over the locations of the substrate 110 at which protruding regions, which will subsequently be processed to form fins, are to be formed from the substrate 110. In such an embodiment, a mask having the desired feature configuration may be defined by removing the mask material 112 through apertures between the solid regions of the photomask and/or transparent carbon mask 113.

Figure 2:
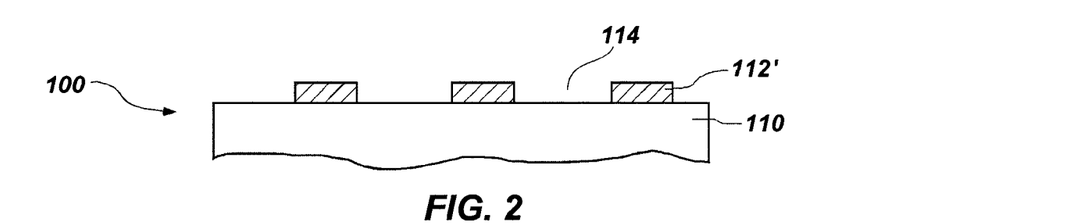

Removal of the mask material 112 may be used to form apertures 114 exposing regions of the substrate 110 where material of the substrate 110 will be removed, as depicted in FIG. 2.

Figure 3:
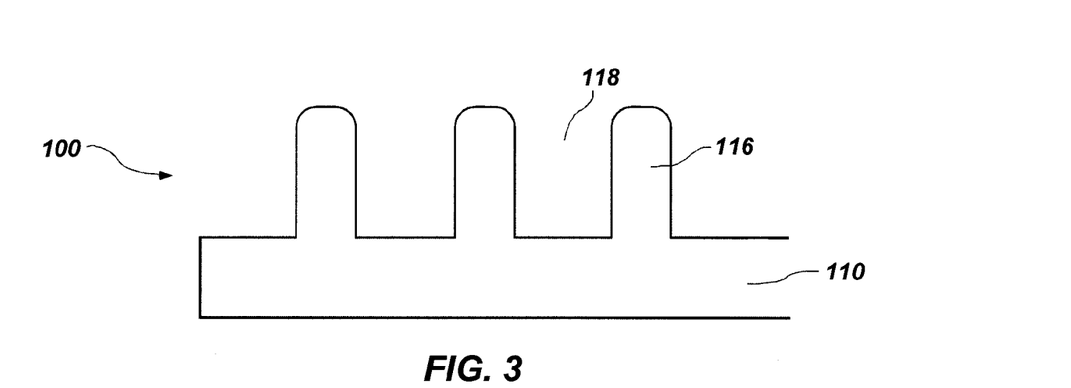

Referring to FIG. 3, one or more protruding regions 116, which may also be characterized simply as "protrusions," are formed from the substrate 110 of the semiconductor device structure 100. Each protruding region 116 may be formed by removing material from a portion of the substrate 110 through apertures 114 in the mask 112' (FIG. 2) to form trenches 118 between adjacent protruding regions 116. In some embodiments, a wet etch may be used to remove material from regions of substrate 110 exposed trough the mask 112'. In some embodiments, material of the substrate 110 may be removed to form protruding regions 116 with heights of from about 100 Å to about 10,000 Å. In some embodiments, the mask 112' may be removed as the substrate 110 is etched. In other embodiments, the mask 112' may be removed after the substrate 110 is etched, such as with an etchant that removed material of the mask 112' without substantially removing material of the substrate 110.

In some embodiments, the protruding regions 116 may be used to form dual fin structures, which may be used as a basis for fabricating various types of semiconductor device structures, including, without limitation, source, drain and channel regions of field effect transistors.

Figure 4:
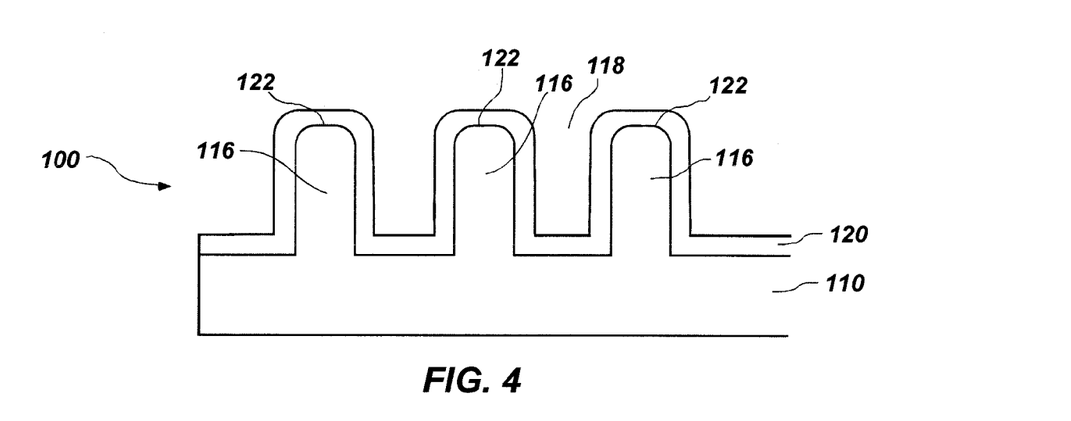

As depicted in FIG. 4, a dual fin-forming mask may be formed over each protruding region 116 by applying another mask material 120 to the substrate 110, covering each protruding region 116 and the surfaces of the trenches 118. The mask material 120 may be applied by techniques known in the art. In various embodiments, the mask material 120 may be deposited by techniques such as, but not limited to, CVD, PLD, ALD, or physical vapor deposition (PVD). In various embodiments, materials known in the art, including, without limitation, conductive materials (e.g., conductive materials that are useful in forming the gates of transistor or other conductive lines that are associated with a memory element), such as titanium nitride (TiN), tungsten nitride (WN), tungsten silicide ($WSi_2$), titanium silicide ($TiSi_2$), platinum silicide (PtSi), cobalt silicide ($CoSi_2$), nickel silicide (NiSi), tungsten (W), tantalum (Ta) and tantalum nitride (TaN), may be used as the mask material 120. In other embodiments, dielectric materials, such as silicon dioxides ($SiO_2$), silicon nitrides (typically $Si_3N_4$), silicon oxynitrides, and the like may be used as mask material 120.

Trenches 118 may, in some embodiments, be at least partially filled with an optional support or mask material (not shown), such as a silicon dioxide, a photoresist, or any other suitable sacrificial material. Such a support or mask material may provide stability and/or prevent removal of material of the substrate 110 while regions of mask material 120 are selectively removed from over the upper end 122 of each protruding region 116.

Figure 5:
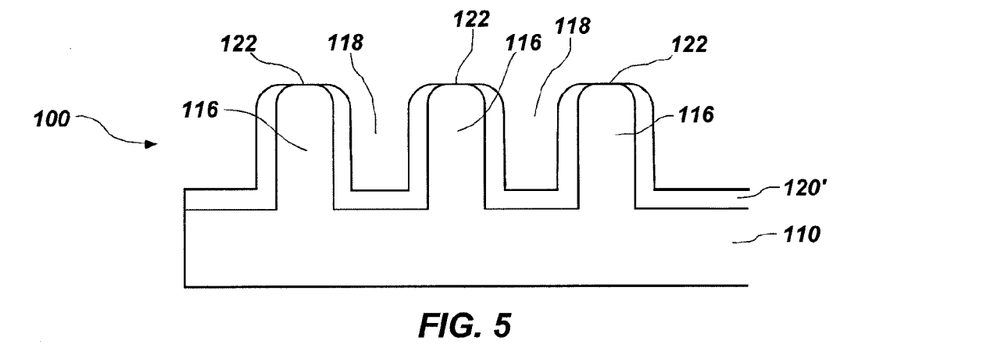

Referring to FIG. 5, in some embodiments, a self-aligned mask 120' may be formed by exposing material of the substrate 110 through the mask material 120 at an upper end 122 of each protruding region 116. The substrate 110 may be exposed, in some embodiments, by removing mask material 120 using chemical-mechanical polishing (CMP) to provide a substantially planar upper surface. In other embodiments, etching processes (in conjunction with a suitable mask) may be used to remove the mask material 120 from above the upper end 122 of each protruding region 116 while limiting the removal of mask material 120 from other locations. These processes expose the material of the substrate 110 in the central region of the upper end 122 of each protruding region 116.

Figure 6:
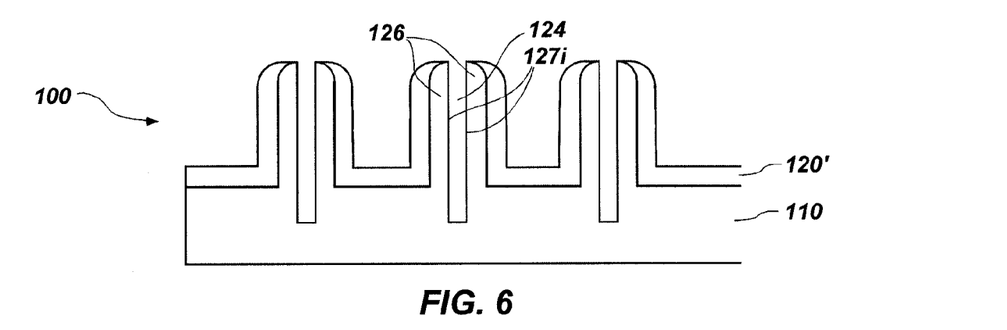

As depicted in FIG. 6, material of the substrate 110 that has been exposed through the mask 120' (i.e., at a central portion of each protruding region 116) may be removed from each protruding region 116 to form a recess 124 between opposed inner surfaces $127_i$. The remaining portions of each protruding region 116, which are located on opposite sides of the recess 124, comprise dual fins 126. The recess 124 may be formed by etching the central portion of each protruding region 116 using the mask 120'. The substrate 110 may be anisotropically etched selective to the material of mask 120'. Removal of material from the substrate 110 results in a recess 124 with a depth of from about 100 Å to about 10,000 Å, which may be only a portion of the height of a protruding region 116, the entire height of a protruding region 116, or the recess 124 may extend into the substrate 110, beyond the base of its corresponding protruding region 116. Stated another way, the bottom of the recess 124 may lie above, coplanar with, or below the bottoms of trenches 118 flanking protruding region 116.

Formation of dual fins 126 may result in a thinner fin structure than those conventionally formed. This may limit the volume of silicon or other semiconducting material that needs to be charged to switch the transistor on and off and, therefore, may reduce the parasitic capacitance of the transistor and may increase its switching speed.

Figure 7:
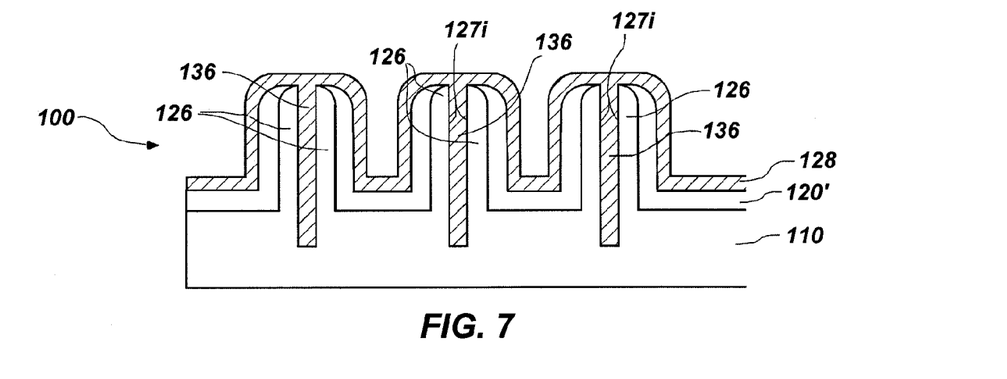
Figure 8:
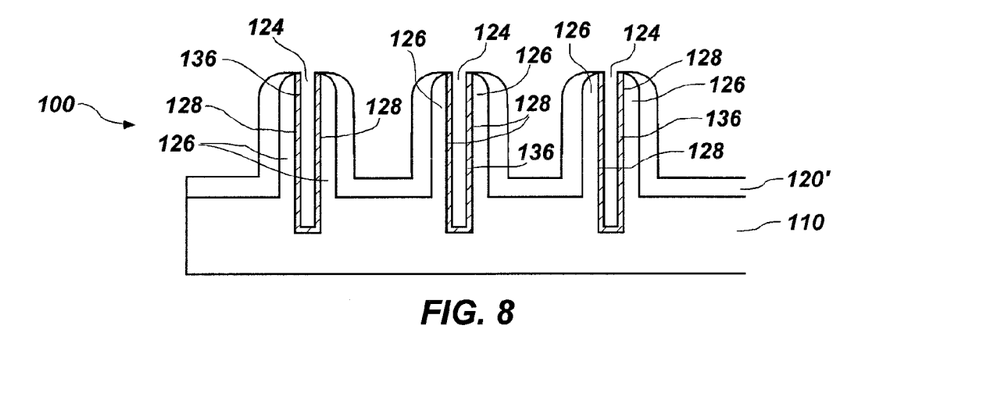

Optionally, a dielectric material 128 may be applied to at least the inner surfaces $127_i$ of the dual fins 126. The dielectric material 128 may substantially fill the recess 124 between the dual fins 126, as shown in FIG. 7, or it may merely coat the dual fins 126, as illustrated in FIG. 8. The dielectric material 128 may be introduced into the recess 124 by known processes, such as material deposition (e.g., CVD, PLD, ALD, etc.) or oxide growth followed by patterning (e.g., mask and etch) processes. The dielectric material 128 may be an oxide, such as $SiO_2$, or a nitride, such as $Si_3N_4$.

The dielectric material 128 may electrically isolate the dual fins 126 from other, subsequently fabricated structures, or the dielectric material 128 may be used to create strain in the semiconductor material of the dual fins 126, which may provide redundancy and improve performance of a transistor formed with the dual fins 126.

Figure 9:
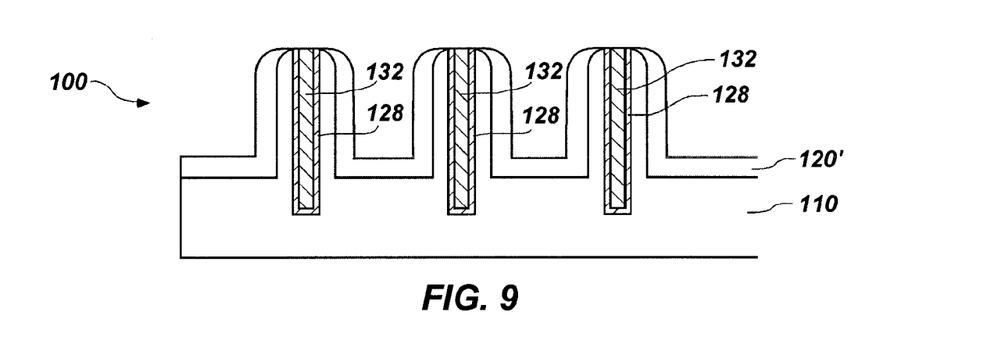

When the dielectric material 128 comprises a coating, as shown in FIG. 8, any voids remaining within the recess 124 between dual fins 126 may be filled with another material, such as a conductive material 132, as shown in FIG. 9. When deposition processes (e.g., CVD, PLD, ALD, PVD, etc.) are used to introduce conductive material 132 into the recess 124, it may be desirable to remove conductive material 132, as well as dielectric material 128, that resides over other locations of the semiconductor device structure (e.g., on the dual fins 126, on areas of the substrate 110 or other structures between adjacent protruding regions 116, etc.). Known mask and etch processes may be used to effect such material removal.

Figure 10:
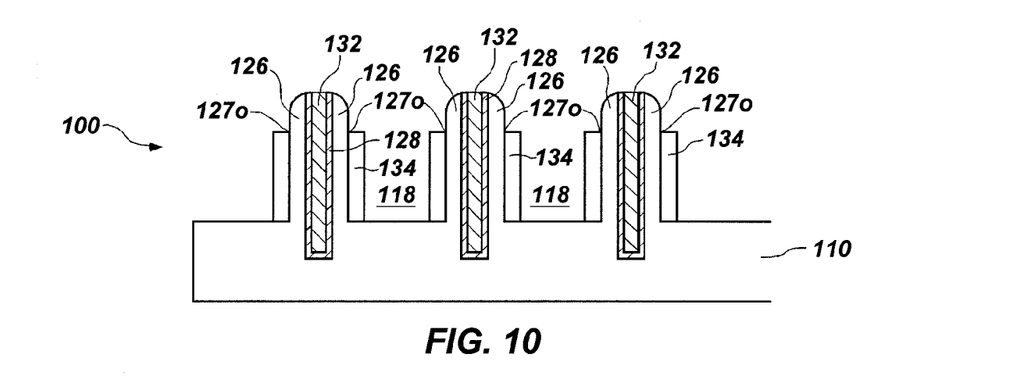
Figure 11:
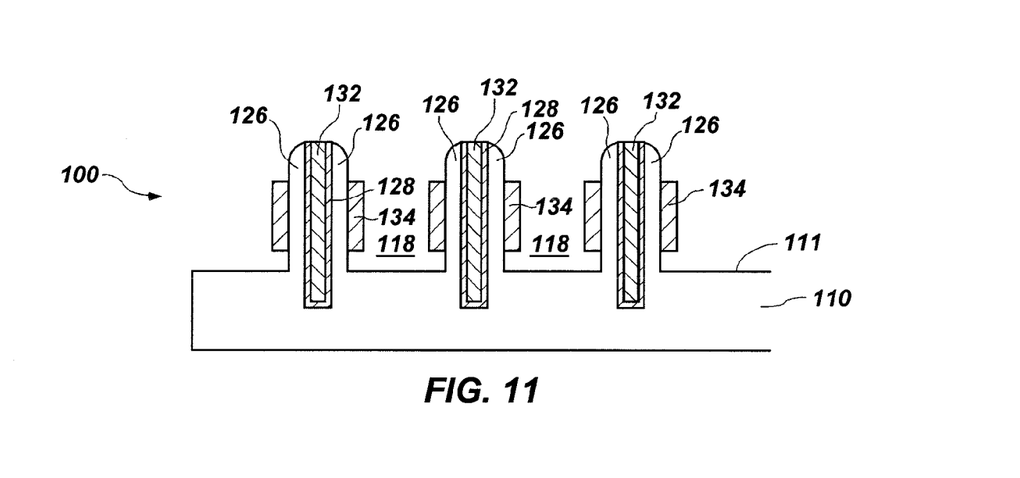

Referring to FIGS. 10 and 11, in embodiments where the material of the mask 120' is a conductive material, the mask 120' may be further patterned to form conductive lines 134 on oppositely facing outer surfaces $127_o$ of the dual fins by removing material from portions of the mask 120'. Such patterning may be effected by forming and patterning a photomask and/or a transparent carbon mask (not shown) and etching portions of the mask 120' exposed through the photomask or transparent carbon mask.

In some embodiments, removal or further patterning of the material of the mask 120' may be effected in such a way that edges of the conductive lines 134 on the dual fins 126 are spaced apart from an active surface 111 of the substrate 110 at the bottoms of adjacent trenches 118, as depicted in FIG. 11. In embodiments such as those shown in FIGS. 10 and 11, the conductive lines 134 may be used as read and write electrodes for a memory element, while the conductive material 132 between the dual fins 126 may act as a gate electrode and dielectric material 128 as a grate dielectric.

In embodiments where mask 120' includes a dielectric material, the semiconductor device structure 100 shown in FIG. 6 may be used to fabricate a field effect transistor, with conductive material (not shown) being subsequently disposed over the mask 120', which serves as a gate dielectric, and patterned by known processes to form the conductive element of one or more FET gates.

Figure 20:
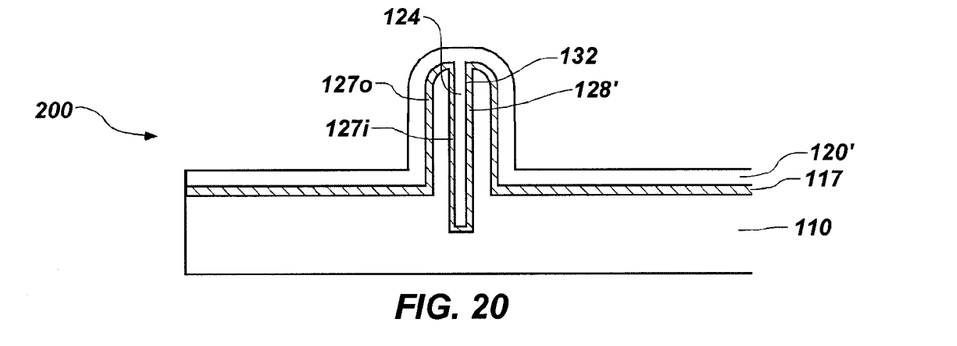

Once the dual fins 126 and the recess 124 therebetween have been formed, dielectric material 128' may be introduced into the recess 124, as illustrated in FIG. 20. The dielectric material 128' may be introduced into the recess 124 by known processes including, but not limited to material deposition (e.g., CVD, PVD, etc.), oxide growth followed patterning (e.g., mask and etch processes). In some embodiments, the dielectric material 128' may be silicon dioxide ($SiO_2$) or silicon nitride ($Si_3N_4$). The dielectric material 128' may coat the opposed inner surfaces 127$_i$ of the dual fins 126.

Figure 18:
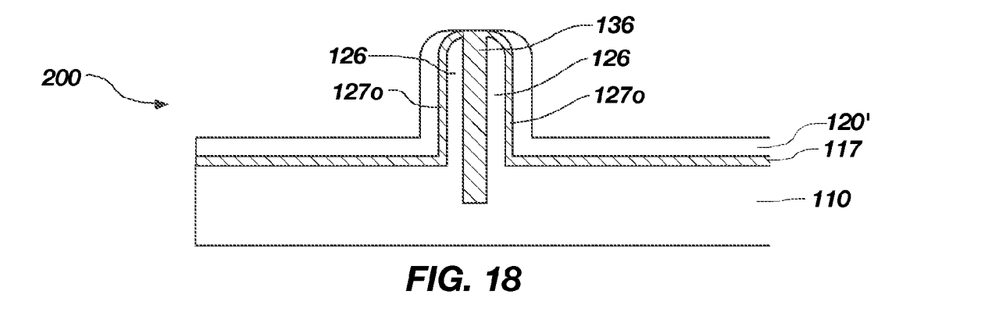
Figure 21:
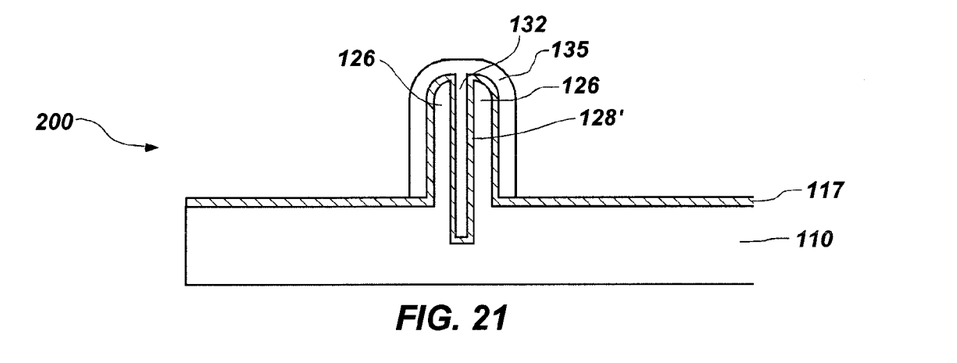

A conductive material (not shown) may then be deposited over the dielectric material of mask 120' and over the dielectric material 128' by known processes (e.g., CVD, PLD, ALD, etc.). The conductive material and, optionally, the underlying mask 120' and/or dielectric material 128', may then be patterned (e.g., by known mask and etch processes) to form a conductive element 135 of a transistor gate, with one or both of the mask 120' and the dielectric material 128' serving as a gate dielectric. FIG. 21 depicts one embodiment of a transistor gate that may be fabricated using the dual fins 126. Another embodiment of FET that may be fabricated in such a manner, which includes a gate for each fin 126 and a recess 124 that may or may not be completely filled with dielectric material 128, is shown in FIG. 18.

Figures 12, 13:
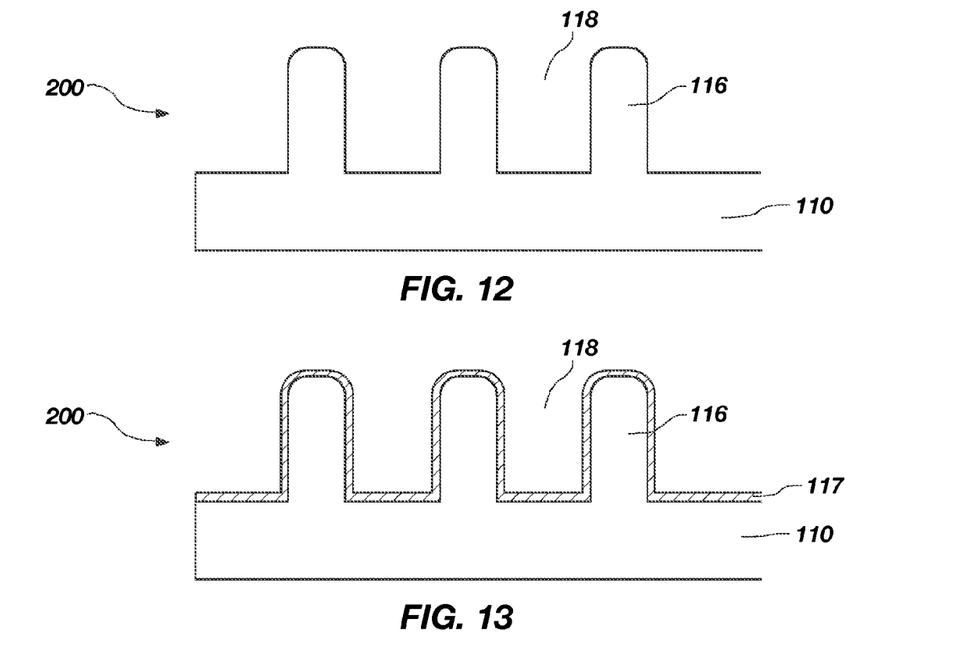
FIGS. 12-21 are cross-sectional views of various embodiments of intermediate semiconductor device structures illustrating embodiments of a dual fin-FET fabrication method.

FIGS. 12-18 depict, in simplified cross-section, another embodiment of a process for fabricating a field effect transistor (FET) that includes dual fins. Referring to FIG. 12, the intermediate semiconductor device structure 200 is shown subsequent to formation protruding regions 116 in the substrate 110. The protruding regions 116 may be formed by removing material from portions of the substrate 110 by methods such as those described above with respect to FIGS. 1 and 2. Referring to FIG. 13, a dielectric material 117 may be applied to the substrate 110 covering the surfaces of each protruding region 116. The dielectric material 117 may be formed and/or applied using techniques known in the art such as CVD, PLD, ALD, or the like. In some embodiments, the dielectric material 117 may be grown or deposited on the substrate 110, according to conventional techniques.

Figure 14:
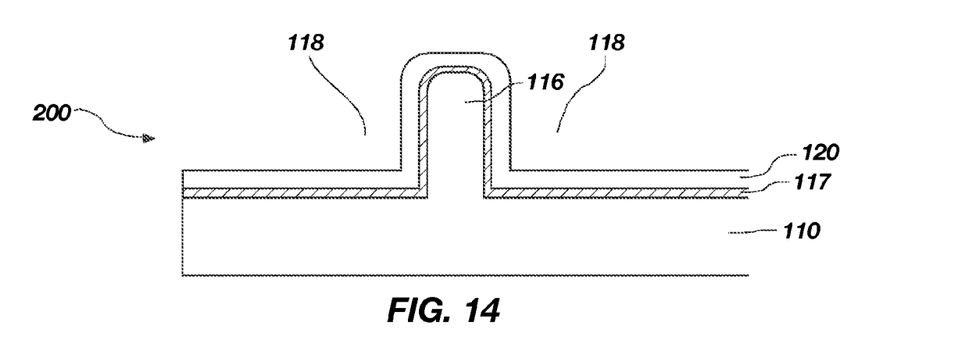

As depicted in FIG. 14, showing only one protruding region 116 and adjacent trenches 118 for clarity and simplicity, a mask material 120 may be applied over the dielectric material 117. The mask material 120 may be formed and/or applied by techniques known in the art including, but not limited to, CVD, PLD, ALD, and PVD. In various embodiments, mask material 120 may include known conductive materials such as, but not limited to, titanium nitride (TiN), tungsten nitride (VA), tungsten silicide ($WSi_2$), titanium silicide ($TiSi_2$), platinum silicide (PtSi), cobalt silicide ($CoSi_2$), nickel silicide (NiSi), tungsten (w), tantalum (Ta) and tantalum nitride (TaN).

Figure 15:
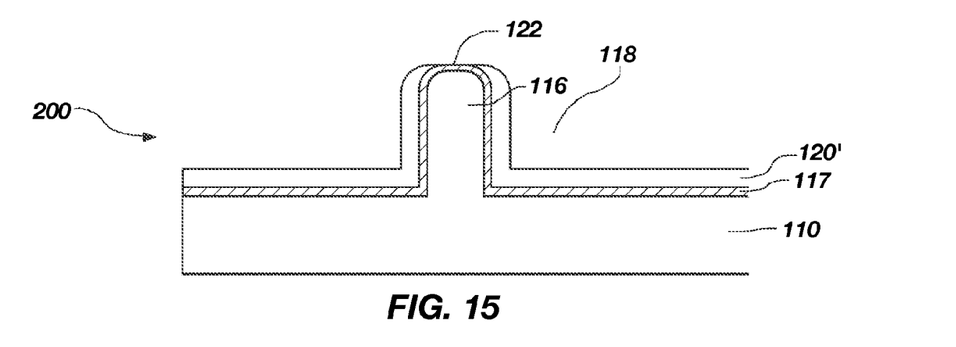

As depicted in FIG. 15, the mask material 120 and the dielectric material 117 that overlie the upper end 122 of each protruding region 116 may be removed to expose the upper end 122 forming a self-aligning mask 120'. In some embodiments, to provide stability during the removal of the mask material 120 and the dielectric material 117, the now lower elevation regions, which are referred to herein as "trenches 118," that are adjacent to each protruding region 116 may be at least partially filled with a support material (not shown), such as an oxide. Chemical-mechanical polishing (CMP) or other polishing or planarization processes may be useful for removing portions of the mask material 120 and the dielectric material 117 from above the upper end 122 of each protruding region 116. In some embodiments, a mask, such as a photomask, or the like, may be employed to protect regions where removal of material from the mask material 120 and the dielectric material 117 is not desired (e.g., within the trenches 118). In such embodiments, selective etching may be used to remove the mask material 120 and the dielectric material 117 without removing the substrate 110 from the upper surface 122.

Figure 16:
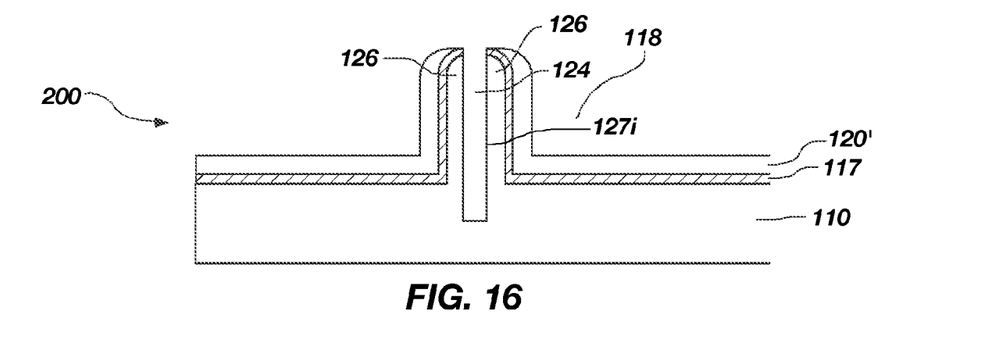

Referring to FIG. 16, a recess 124 may be formed by removing material from a central portion of each protruding region 116 through mask 120' to form a recess 124 within the protruding region 116. The remaining portions of each protruding region 116 comprise dual fins 126, which are located on opposite sides of the recess 124. In some embodiments, the mask 120' may be used as a self-aligned hard mask through which the material of the substrate 110 is selectively etched to form the recess 124 between the fins 126. The substrate 110 may be anisotropically etched selective to the mask 120'. The substrate 110 may be removed to form a recess 124 with a depth of from about 100 Å to about 10,000 Å, which may be less than, about the same as, or more than the height of a protruding region 116. Stated another way, the bottom of the recess 124 may lie above, coplanar with, or below the bottoms of trenches 118 flanking protruding region 116.

As described above, the formation of dual fins 126 may limit the volume of silicon or other semiconducting material that needs to be charged to switch the transistor on and off and, therefore, may reduce the parasitic capacitance of the transistor and may increase its switching speed.

Figure 17:
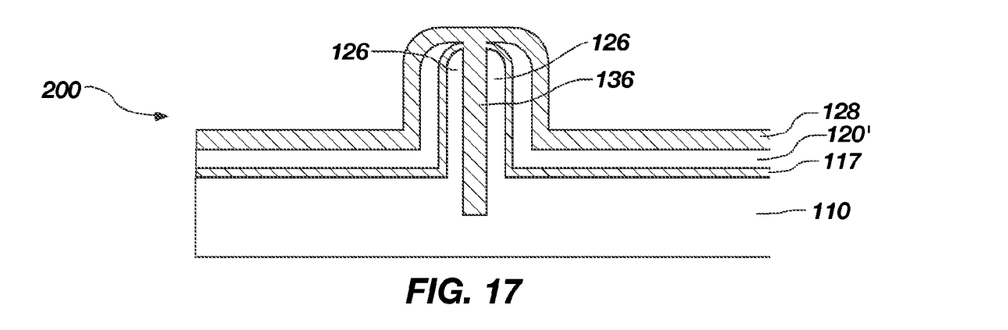

Referring to FIG. 17, dielectric material 128 may be introduced onto surfaces of the recess 124 between the dual fins 126. The dielectric material 128 may be introduced into the recess 124 by known processes including, but not limited to material deposition (e.g., CVD, PVD, etc.), oxide growth followed patterning (e.g., mask and etch process). In some embodiments, the dielectric material 128 may be $SiO_2$ or $Si_3N_4$. The dielectric material 128 may fill the recess 124 between the dual fins 126 as shown in FIG. 17.

Portions of the dielectric material 128 that overlie the mask 120' or that overlie the surfaces of other features outside of the recess 124 may be removed. The dielectric material 128 may be removed by techniques known in the art, such as by mask and etch processes. As shown in FIG. 18, when dielectric material 128 fills the recess 124, the removal of dielectric material 128 from locations outside of the recess 124 may result in an isolation structure 136 within the recess 124.

Figure 19:
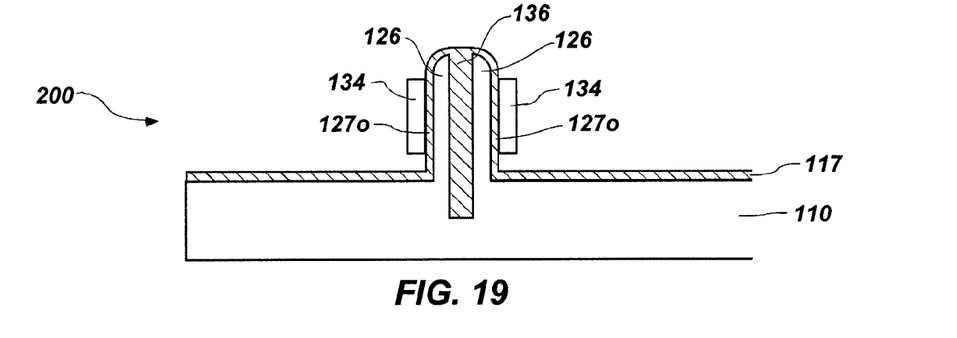

As shown in FIG. 19, in embodiments where the material of the mask 120' is a conductive material, portions of the mask 120' may be removed to form conductive lines 134 on oppositely facing outer surfaces 127$_o$ of the dual fins 126. Removal of portions of the mask 120' may be effected by forming and patterning a photomask and/or a transparent carbon mask (not shown) and etching portions of the mask 120' exposed through the photomask or transparent carbon mask. The conductive lines 134 may be used as read and write electrodes for a memory element.

Referring back to FIG. 16, a dielectric material 128' (FIG. 20) may be applied to at least the inner surfaces 127; of the dual fins 126 as shown in FIG. 20. In some embodiments, a conductive material 132 may be applied to fill the recess 124. As shown in FIG. 21, portions of the mask 120' may be removed to form a conductive element 135 of a transistor gate, with one or both of the mask 120' and the dielectric material 128' serving as a gate dielectric.

Thus, an array of fin-FET transistors may be formed according to the embodiments described herein. Such a transistor array may be fabricated in a conventional pattern, side-by-side on a substrate. The transistor array may include a substrate with multiple dual fins formed therein according to the embodiments described herein.

Figure 22:
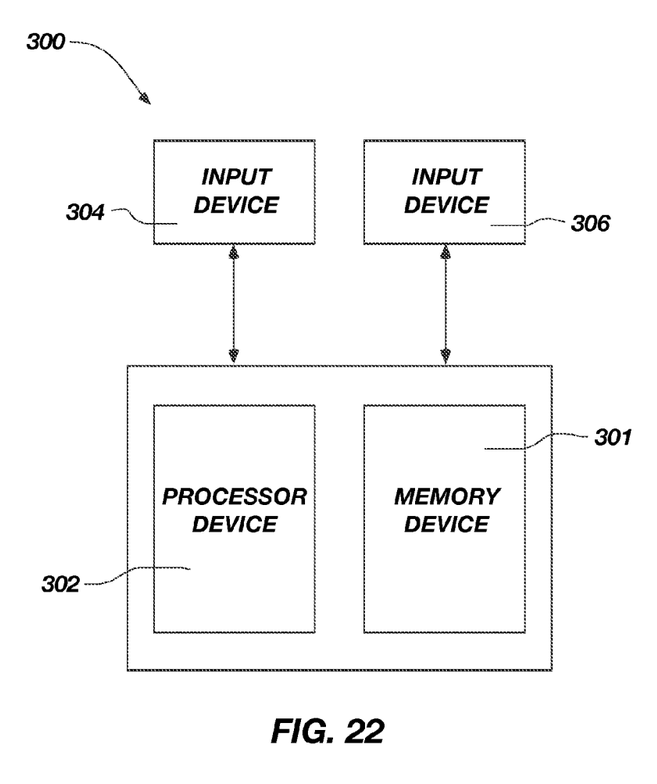
FIG. 22 is a schematic block diagram illustrating one embodiment of an electronic system of the present invention that includes a semiconductor device as described herein below.

Semiconductor devices that include dual fins fabricated in accordance with embodiments of the present invention, including, without limitation, fin-PET devices, may be used in embodiments of electronic systems of the present invention. For example, FIG. 22 is a block diagram of an illustrative electronic system 300 according to the present invention. The electronic system 300 may comprise, for example, a computer or computer hardware component, a server or other networking hardware component, a cellular telephone, a digital camera, a personal digital assistant (PDA), portable media (e.g., music) player, etc. The electronic system 300 includes at least one memory device 301. The system 300 further may include at least one electronic signal processor device 302 (often referred to as a "microprocessor"). At least one of the electronic signal processor device 302 and the at least one memory device 301 may comprise, for example, an embodiment of the semiconductor device structure 100 shown in FIGS. 1-11 or an embodiment of the semiconductor device structure 200 shown in FIGS. 12-21. Stated another way, at least one of the electronic signal processor device 302 and the at least one memory device 301 may comprise an embodiment of a transistor having dual fins as previously described in relation to either the semiconductor device structure 100 or the semiconductor device structure 200. The electronic system 300 may further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, a display, a printer, an audio output jack, a speaker, etc. In some embodiments, the input device 304 and the output device 306 may comprise a single touch screen device that can be used both to input information to the system 300 and to output visual information to a user. The one or more input devices 304 and output devices 306 may communicate electrically with at least one of the memory device 301 and the electronic signal processor device 302.

Although the foregoing description includes many specifics, these should not be construed as limiting the scope of the present invention but, merely, as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein, which fall within the meaning and scope of the claims, are to be embraced thereby.

What is claimed is:

1. A method for fabricating a semiconductor device, comprising:
    forming a plurality of trenches in a substrate with at least one protruding region therebetween;
    applying a mask material over the at least one protruding region without filling the plurality of trenches;
    exposing a portion of an upper end of the at least one protruding region through the mask material; and
    forming a pair of fins from the at least one protruding region by removing the exposed portion of the substrate at the upper end of the at least one protruding region to form a trench therein.

2. The method of claim 1, wherein exposing a portion of an upper end of the at least one protruding region through the mask material comprises rendering the mask material substantially coplanar with the upper end of the protruding region.

3. The method of claim 1, wherein exposing a portion of an upper end of the at least one protruding region through the mask material comprises polishing the mask material to a level substantially planar with the portion of the upper end of the at least one protruding region.

4. The method of claim 1, wherein forming a plurality of trenches in a substrate comprises selectively removing at least a portion of a silicon substrate.

5. The method of claim 1, wherein forming a plurality of trenches in a substrate with at least one protruding region therebetween comprises forming the at least one protruding region with a height of about 100 Å to about 10,000 Å from bases of the plurality of trenches.

6. The method of claim 1, wherein applying a mask material over the at least one protruding region comprises applying a dielectric material over the at least one protruding region without filling the plurality of trenches.

7. The method of claim 1, wherein applying a mask material over the at least one protruding region comprises applying a conductive material over the at least one protruding region without filling the plurality of trenches.

8. The method of claim 7, wherein applying a conductive material comprises applying at least one of titanium nitride, tungsten nitride, tungsten silicide, titanium silicide, platinum silicide, cobalt silicide, nickel silicide, tungsten, tantalum, and tantalum nitride.

9. The method of claim 7, wherein applying the mask material further comprises applying a dielectric material over the at least one protruding region without filling the plurality of trenches, and further comprising applying a conductive material over the dielectric material.

10. The method of claim 9, wherein applying the dielectric material over the at least one protruding region without filling the plurality of trenches comprises forming a gate dielectric over the pair of fins.

11. The method of claim 10, further comprising patterning the conductive material to define at least one conductive element of at least one transistor gate.

12. The method of claim 7, further comprising patterning the conductive material to define at least one conductive element.

13. A method for fabricating a semiconductor device, comprising:
    forming a plurality of trenches in a substrate to form a plurality of protrusions therebetween;
    applying a mask material over the substrate and over the plurality of protrusions;
    exposing portions of upper ends of the plurality of protrusions by removing at least a portion of the mask material to render the remaining mask material substantially coplanar with the upper ends of the plurality of protrusions;
    removing substrate material from the exposed portions of the upper ends of the plurality of protrusions to form recesses between fin structures;
    applying a dielectric material over the substrate to form a lining on the sidewalls of the recesses;

applying a conductive material over the plurality of protrusions to fill the recesses; and forming conductive lines on the fin structures on sides thereof opposite the recesses.

14. The method of claim 13, wherein forming a plurality of trenches in a substrate to form a plurality of protrusions therebetween comprises forming a plurality of trenches in a silicon substrate.

15. The method of claim 13, wherein forming a plurality of trenches in a substrate to form a plurality of protrusions therebetween comprises forming plurality of trenches with a depth of from about 100 Å to about 10000 Å.

16. The method of claim 13, wherein applying a conductive material over the plurality of protrusions to fill the recesses comprises applying a conductive material comprising at least one of titanium nitride, tungsten nitride, tungsten silicide, titanium silicide, platinum silicide, cobalt silicide, nickel silicide, tungsten, tantalum, and tantalum nitride.

17. The method of claim 13, wherein applying a conductive material over the plurality of protrusions comprises applying titanium nitride.

18. The method of claim 13, wherein exposing portions of the upper ends of the protrusions comprises chemical-mechanical polishing at least a portion of the mask material to render the remaining mask material substantially coplanar with the upper ends of the plurality of protrusions.

19. The method of claim 13, wherein removing substrate material from the exposed portions of the upper ends of the plurality of protrusions to form recesses between fin structures comprises forming the recesses extending below the bottoms of the plurality of trenches.

20. The method of claim 13, wherein removing substrate material from the exposed portions of the upper ends of the plurality of protrusions to form recesses between fin structures comprises forming the recesses having bottoms substantially coplanar with bottoms of the plurality of trenches.

21. The method of claim 13, wherein applying a conductive material to fill the recesses comprises applying a conductive material comprising at least one of titanium nitride, tungsten nitride, tungsten silicide, titanium silicide, platinum silicide, cobalt silicide, nickel silicide, tungsten, tantalum, and tantalum nitride.

22. The method of claim 13, wherein forming conductive lines on the fin structures on sides thereof opposite the recesses comprises removing at least a portion of the mask material to form the conductive lines on the sides of the fin structures.

23. The method of claim 13, wherein forming conductive lines on the fin structures on sides thereof opposite the recesses comprises depositing a conductive material over outer surfaces of the protrusions and removing portions thereof.

24. A method for fabricating a semiconductor device, comprising:

forming a plurality of trenches in a substrate with at least one protruding region therebetween;

applying a conductive material over the at least one protruding region;

exposing a portion of an upper end of the at least one protruding region through the conductive material to form a mask; and forming a pair of fins from the at least one protruding region by removing the exposed portion of the substrate at the upper end of the at least one protruding region to form a trench therein.

* * * * *

UNITED STATES PATENT AND TRADEMARK OFFICE
CERTIFICATE OF CORRECTION

PATENT NO.      : 7,902,057 B2                                    Page 1 of 1
APPLICATION NO. : 11/831296
DATED           : March 8, 2011
INVENTOR(S)     : Terrence McDaniel It is certified that error appears in the above-identified patent and that said Letters Patent is hereby corrected as shown below:

In column 9, line 11, in Claim 15, delete "forming plurality" and insert -- forming a plurality --, therefor.

Signed and Sealed this
Tenth Day of May, 2011

David J. Kappos
*Director of the United States Patent and Trademark Office*